(12) United States Patent
Mahajan et al.

(10) Patent No.: US 9,368,455 B2
(45) Date of Patent: Jun. 14, 2016

(54) ELECTROMAGNETIC INTERFERENCE SHIELD FOR SEMICONDUCTOR CHIP PACKAGES

(71) Applicants: Ravindranath V. Mahajan, Tempe, AZ (US); John S. Guzek, Chandler, AZ (US); Adel A. Elsherbini, Chandler, AZ (US); Nitin Ashok Deshpande, Chandler, AZ (US)

(72) Inventors: Ravindranath V. Mahajan, Tempe, AZ (US); John S. Guzek, Chandler, AZ (US); Adel A. Elsherbini, Chandler, AZ (US); Nitin Ashok Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/229,771

(22) Filed: Mar. 28, 2014

(65) Prior Publication Data
US 2015/0279789 A1 Oct. 1, 2015

(51) Int. Cl.
*H01L 23/00* (2006.01)
*H01L 23/552* (2006.01)
*H01L 21/56* (2006.01)

(52) U.S. Cl.
CPC ............. *H01L 23/552* (2013.01); *H01L 21/56* (2013.01); *H01L 24/19* (2013.01); *H01L 24/96* (2013.01); *H01L 21/568* (2013.01); *H01L 24/16* (2013.01); *H01L 2224/04105* (2013.01); *H01L 2224/12105* (2013.01); *H01L 2224/16225* (2013.01); *H01L 2224/97* (2013.01); *H01L 2924/12042* (2013.01); *H01L 2924/14* (2013.01); *H01L 2924/1421* (2013.01); *H01L 2924/157* (2013.01); *H01L 2924/15311* (2013.01); *H01L 2924/181* (2013.01); *H01L 2924/1815* (2013.01)

(58) Field of Classification Search
CPC .... H01L 23/552; H01L 23/5384; H01L 23/60
USPC .................................................. 257/659, 621
See application file for complete search history.

(56) References Cited

U.S. PATENT DOCUMENTS

| | | | |
|---|---|---|---|
| 8,093,691 B1* | 1/2012 | Fuentes ............... | H01L 23/3128 257/659 |
| 2010/0224969 A1* | 9/2010 | Tang .............................. | 257/660 |
| 2011/0156239 A1 | 6/2011 | Jin | |
| 2012/0018897 A1* | 1/2012 | Park et al. ..................... | 257/774 |
| 2012/0025356 A1* | 2/2012 | Liao ................... | H01L 23/3121 257/659 |
| 2012/0280366 A1* | 11/2012 | Kamgaing et al. ............. | 257/621 |
| 2012/0286415 A1* | 11/2012 | Sakai ...................... | H01L 24/97 257/734 |
| 2013/0292808 A1* | 11/2013 | Yen et al. ...................... | 257/660 |
| 2014/0021591 A1* | 1/2014 | Sung .................... | H01L 23/60 257/659 |
| 2014/0061866 A1* | 3/2014 | Lee .............................. | 257/621 |

* cited by examiner

*Primary Examiner* — Moazzam Hossain
(74) *Attorney, Agent, or Firm* — Blakely, Sokoloff, Taylor & Zafman LLP

(57) ABSTRACT

An electromagnetic interference shield is described for semiconductor chip packages. In some embodiments, a package has a semiconductor die, a redistribution layer, a mold compound over the die, a plurality of vias through the mold compound and outside the die to form a shield, and a metal film over the vias, and over the mold compound.

13 Claims, 4 Drawing Sheets

ELECTROMAGNETIC INTERFERENCE SHIELD FOR SEMICONDUCTOR CHIP PACKAGES

FIELD

The present disclosure relates to the field of semiconductor chip packaging and, in particular to shields for electromagnetic interference in such packages.

BACKGROUND

Semiconductor and micromechanical dies or chips are frequently packaged for protection against an external environment. The package provides physical protection, stability, external connections, and in some cases, cooling to the die inside the packages. Typically the chip or die is attached to a substrate and then a cover that attaches to the substrate is placed over the die. Alternatively, the die is attached to a cover and then a package substrate is formed on the die.

While there is a trend to add more functions to each die, there is also a trend to put more than one die in a single package. Since a package is typically much larger than the die that it contains, additional dies can be added without significantly increasing the size of the package. Current packaging technologies include stacking dies on top of each other and placing dies side-by-side on a single package substrate. Consolidating more functions into a single die and placing more dies into a single package are ways to reduce the size of the electronics and micromechanics in a device.

As wireless connectivity is expanded to more devices and the sizes of these devices are reduced, RF (Radio Frequency) packages are placed ever closer to digital and baseband packages. The digital and baseband packages typically generate noise and interference that can disrupt or impair the operation of the RF systems. At the same time, RF systems may generate radio interference that impairs the operation of the digital and baseband systems. As a result, the RF modem is typically shielded by a metal case that covers the package or is a part of the package to avoid interference from the digital circuitry. Such an external EMI (Electro-Magnetic Interference) shield is frequently placed over packages for cell phones, tablets, notebook computers, wireless routers, and other communication devices after the packages are surface mounted to a PCB (printed circuit board) for the device.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1A:
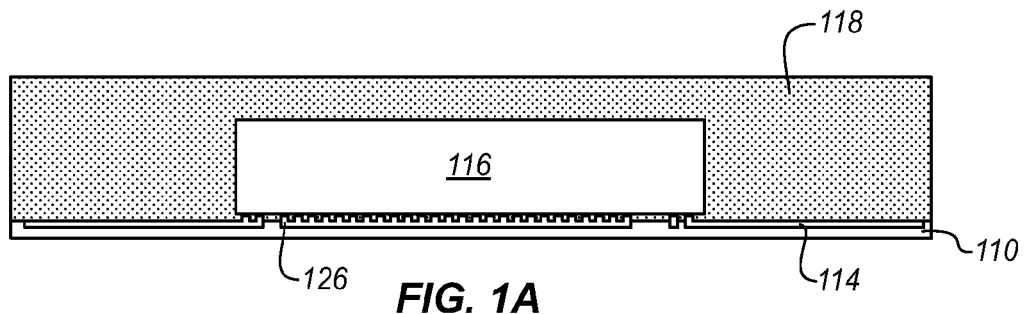
FIG. 1A is a cross-sectional side view diagram of a package in a first stage of fabrication according to an embodiment of the invention.

An EMI (electromagnetic interference) shield may be integrated into any of a variety of different types of semiconductor chip packages, including an ePLB (embedded panel-level ball grid array) package. In some embodiments, after the die is embedded in mold compound and the redistribution layers are complete, laser vias are drilled through the mold compound to a ground connection on the first metal layer. Once this ground connection is exposed, a metal thin film (e.g. Ti or Cu) is sputtered over the back side of the package, and into the vias, to connect to the package ground. The continuous metal ground layer thus formed on the backside of the package serves as an EMI shield.

By integrating the EMI shield into the package, the external shield may be eliminated. This eliminates the need to purchase and install an external shield after the packages are mounted, using SMT (Surface Mount Technology) for example. This reduces PCB assembly time and eliminates failures due to improperly mounted shields.

RF, digital, and baseband chips fabricated in different chip processes are often packaged and the packages are placed on a single PCB. For even smaller form factors, these chips can be combined together into a common package. Metal shields have been used to prevent the digital chips from interfering with the RF circuitry. Digital circuitry and the power supplies for such circuitry may operate at frequencies of from 500 MHz to 3 GHz. A single digital chip may have millions of switches operating at these frequencies and creating noise at these frequencies and at the overtones of these frequencies. This noise can radiate from the digital circuitry into other parts of a package or even a system. These frequencies are the same as or close to the radio frequency ranges that are used by electronic systems for wireless communications. As a result, antennas, filters, multiplexers, modulators, up and down converters, amplifiers, and gain stages can all be impacted by the noise generated by a nearby digital chip.

Mobile communication systems and wireless connectivity devices have several chips such as application processors, memories, BB (Baseband) communication processors, and RF modems. On a mobile PCB, the RF modem is typically separated out from the other components and shielded by a metal case to avoid interference from the digital circuitry. The system can be made smaller by incorporating the whole system in one package. This creates difficulties in shielding the RF sub-system that is inside the same package with the digital and baseband system.

As described herein, different chips forming part of or even a complete mobile system may be packaged together as a SiP (System in a Package). The sensitive RF modem may be isolated by shield layers of metal or another appropriate material to reduce the impact of the aggressive digital circuits which are clocked with frequencies lying in the RF frequency ranges.

The package and shielding allow several chips to be combined to form a complete mobile system in a single package. The shielding may also be used to place separate packages close together on a single PCB or on nearby PCBs. The package can include the RF modem which is sensitive to the interference coming from the operation of the digital circuits. The chips that contain the digital circuits might be an application processor, a memory, a power management unit, a baseband signal processing circuit and any of a variety of other different chips.

FIG. 1A is a cross sectional side view diagram of an ePLB (embedded Panel Level Ball grid array) package with an embedded die or chip 116. The package has a redistribution layer (RDL) 110 or package substrate with a number of pads 114 for solder ball 112 connections to a system board or other components. The embedded chip 116 is attached to the package substrate 110 and has pads 124 for connection to the substrate. The RDL connects the pads 114 from the embedded chip to a system board through the solder ball array 112 (shown in FIG. 1D).

For a typical ePLB package, the die is diced from a wafer after the die is fully formed. The back side of the die is then attached to a panel (not shown). The RDL is formed opposite the panel and the panel may be removed. If the panel is not removed, then the panel is cut to separate the dies from each other. The panel may be removed later or used in the final package to provide additional rigidity or some other function. Typically there are many dies attached to the panel so that the RDL can be formed over many dies at the same time.

The RDL may have a first dielectric layer closest to the chip, a conductor layer with metal pathways, and a solder stop layer. The chip is connected to the metal pathways by vias through the first dielectric layer. The metal pathways may be formed of any of a variety of different metals including copper, aluminum, titanium, tungsten, nickel, palladium, gold, or of metal alloys including one or more of copper, aluminum, titanium, tungsten, nickel, palladium, and gold. The RDL may be in the form of a silicon package substrate, a pre-preg or FR-4 package substrate, a BBUL (Bumpless Build-Up Layer, or alternating patterns of dielectric and conductive layers formed in the die in place. The particular choice or RDL may be adapted to suit any of a variety of different package types.

A mold compound 118 is then applied over the back side of the die 116. The mold or molding compound may be formed of any of a variety of different materials, depending on the nature of the package and its intended use. Suitable mold compounds may include, or may consist of, a plastic material, such as a thermosetting polymer or an epoxy resin or a filled epoxy resin such as a thermosetting mold compound. Alternatively, an underfill or other material may be used to protect the die.

The EMI shield described herein may alternatively be applied to an eWLB (embedded Wafer Level Ball grid array) package. In an eWLB package, the wafer is first embedded in a mold compound also referred to as a molding compound 118. The front side redistribution layer 110 is then formed on the front side surface of the chip.

The molding compound 118 serves as a package cover and completely encloses the embedded chip for protection. In alternative embodiments, a second backside RDL (not shown) is formed over the mold compound. It is on the opposite side of the chip from the front side RDL 110. The backside RDL allows additional connections to be made to the chip and also allows the chips to be stacked or placed side-by-side. The present invention may be applied to all such variations. While only a single chip and a single through-mold via is shown, there may be many more. While only a few solder ball connections are shown, there may be many more.

The EMI shield may alternatively be applied to a flip chip package. For a flip chip package, the front side RDL is replaced by a substrate. The chip is connected to this substrate by means of a flip chip interconnect. The substrate is typically formed of silicon, or any of a variety of PCB materials such as FR4. For other package types, build-up layers with metal pathways may be used to connect different pads together and to fan out the connections on the chip to connect to corresponding pads on a circuit board or other component.

Figure 1B:
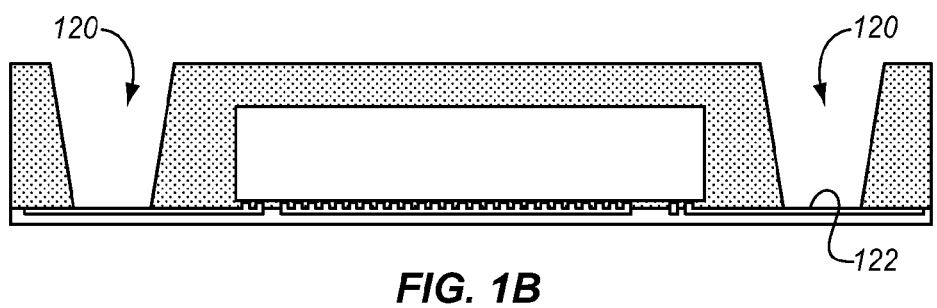
FIG. 1B is a cross-sectional side view diagram of a package in a second stage of fabrication according to an embodiment of the invention.
Figure 2A:
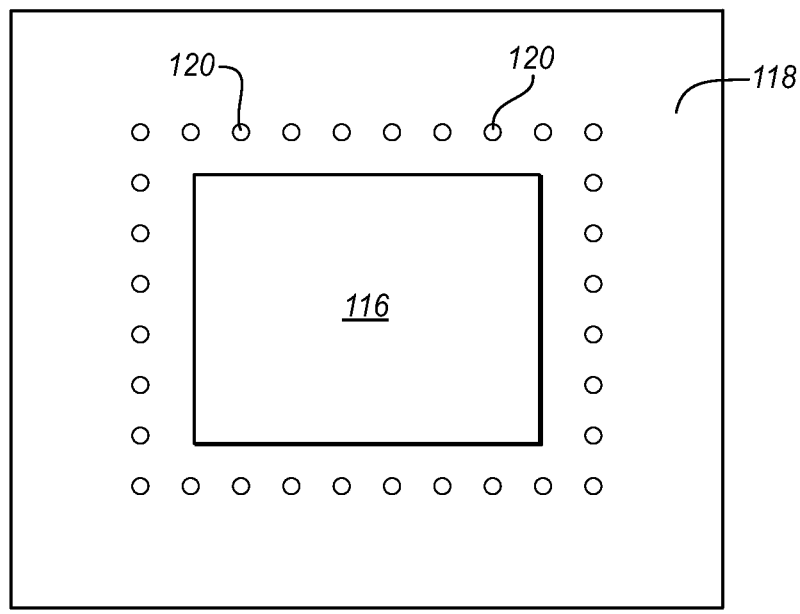
FIG. 2A is a cross-sectional top view diagram of a package with a shield pattern surrounding a die according to an embodiment of the invention.
Figure 2B:
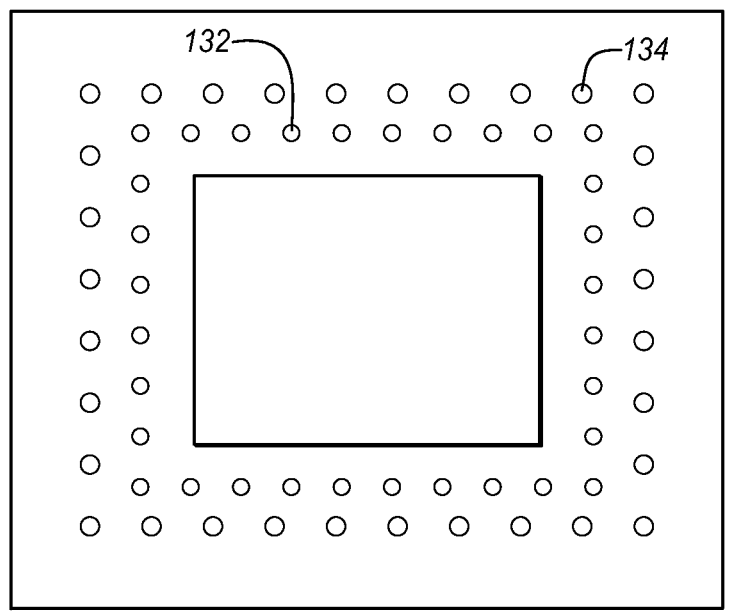
FIG. 2B is a cross-sectional top view diagram of a package with an alternative shield pattern surrounding a die according to an embodiment of the invention.

In FIG. 1B, through mold vias 120 are formed through the mold compound from the back side of the die to the RDL. The vias may be formed by laser drilling, etching, or in any of a variety of other ways. The RDL is configured to have a ground layer 122 at the bottom of the vias, so that when the vias are formed, the bottoms of the vias connect to the ground. Through this ground layer, the vias will then connect though the BGA to a ground connection on the PCB. While only one via 120 is visible on each side of the die 116 in this cross-sectional view, as shown in FIGS. 2A and 2B multiple vias are formed. The vias are typically in a row or line on one or more sides of the die.

Figure 1C:
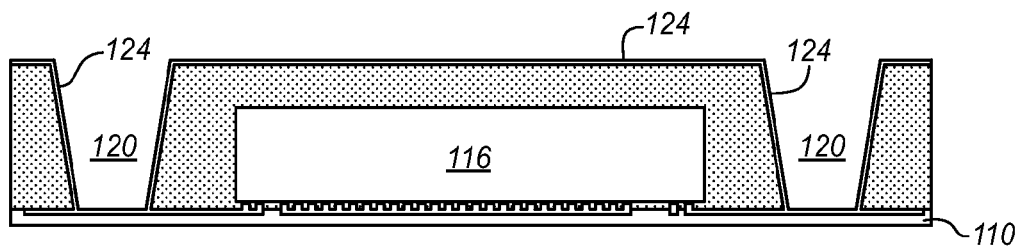
FIG. 1C is a cross-sectional side view diagram of a package in a third stage of fabrication with a shield layer according to an embodiment of the invention.

FIG. 1C is a cross-sectional side view diagram of the die and mold compound after the vias have been formed. A metal layer 124 is applied over the back side of the mold compound and into the vias. The metal layer may be copper, aluminum, gold, or any other electrically conductive material including non-metals. It may be applied by sputtering, by deposition, or in a variety of other ways. The metal layer physically contacts and electrically connects with the ground layer of the RDL.

Figure 1D:
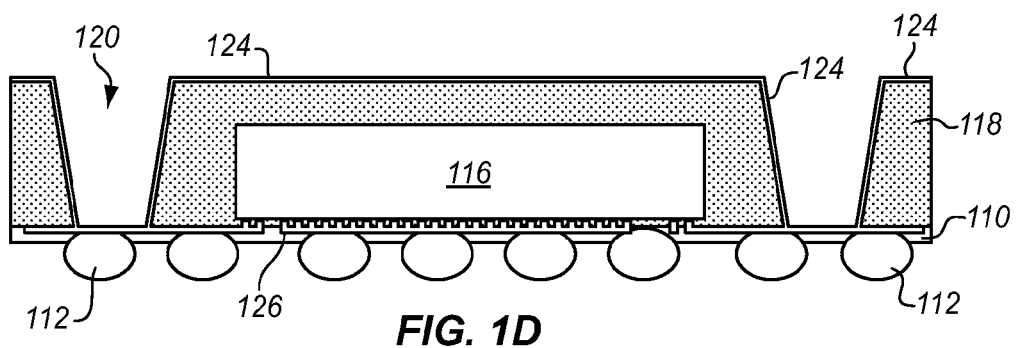
FIG. 1D is a cross-sectional side view diagram of a finished package according to an embodiment of the invention.

In FIG. 1D, the package is finished by attaching solder balls 112 to the RDL of the front side of the package. The package may be further finished with additional coatings or covers. The package may be covered with another layer of mold compound or it may be covered with a molded polymer cover or both, depending on the particular type of package. In addition, additional dies, RDLs, passive components, or other elements may be added to the package to form system in a package, or multi-chip packages of different types. The metal layer 124 may be covered with polymer or dielectric resins for protection and the vias may be filled to provide protection and physical stability to the package. Alternatively, the vias may be filled with metal instead of coated with metal.

FIG. 2A is a cross-sectional top view diagram of the package of FIG. 1D through the vias. As shown, the vias have been formed all around the die. While there are gaps between the vias, the vias are close enough together to form an EMI shield. In some embodiments, the size and position of the vias form a Faraday cage around the die.

In this example, the vias are formed in four lines, one on each of the four sides of the rectangular die. The spacing of the vias is regular and selected to provide the desired amount and type of EMI shielding. For dies of different shapes, the vias may be aligned in a different shape. While the die is shown as surrounded on all four sides, fewer sides may be protected, depending on the needs of the system. Because the package RDL and the mold extends past the die, the vias may be formed as through-mold vias outside the edge of the die.

The amount of EMI shielding provided by the vias depends on the package design rules, and the distance between the vias. To provide even more shielding, as shown in FIG. 2B, one or more extra rows of vias can be used. FIG. 2B is an alternative embodiment to that of FIG. 2A in which there is an inner pattern 132 of vias and an outer pattern 134 of vias. As in FIG. 2A, the inner pattern is shown as a rectangular pattern with a row of vias on each of the four sides of the die and connecting to each other or meeting with the adjacent row at each of the four corners of the die. The four rows of vias surround the die on four sides and are spaced a small distance from the periphery of the die. In this way, the vias surround the die.

The bottom of the die is shielded by the RDL (not shown) and the top of the die is shielded by the solid metal layer over the top of the die as shown in FIG. 1D. The thickness and material of this layer may be selected based on the particular EMI or RF shielding that is desired.

The outer rows of vias are spaced apart from the inner rows and alternate in position with the inner row. In other words, each outer row via is between two inner row vias. From the perspective of the die, there is an unobstructed straight line path from the center of each via to a point on the edge of the die. Except at the corner, this path is at a right angle or as a normal to the edge of the die. This alternating pattern further aids in shielding interference.

Figure 3:
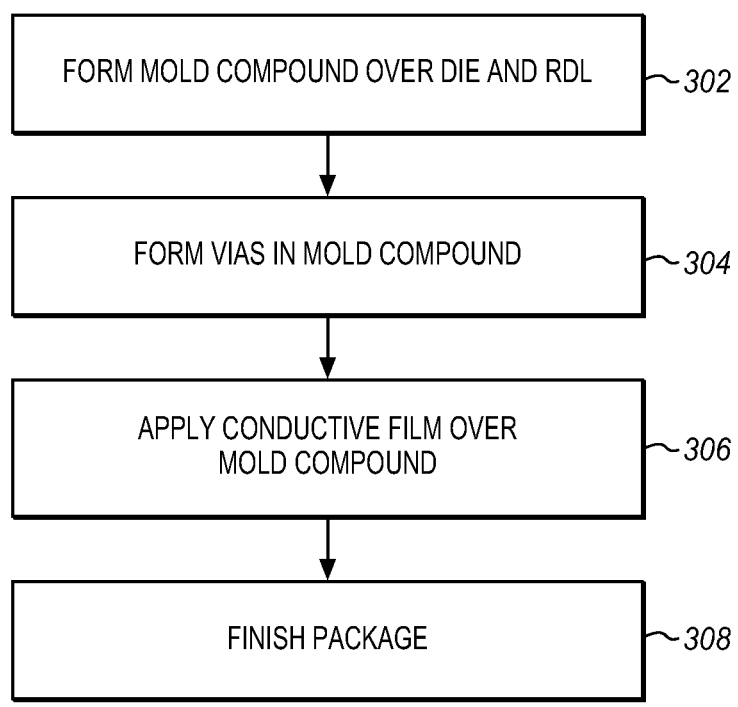
FIG. 3 is a process flow diagram of forming a package with a shield layer according to an embodiment of the invention.

FIG. 3 is a process flow diagram of forming a package with an EMI or RF shield as described herein. At 302 a mold compound is formed over a die and an RDL. As described above, the die is over the RDL on one side and the mold compound is formed on the opposite side. In the illustrated examples the RDL is on the front side and the mold compound is formed over the back side of the die and over the RDL. The RDL extends past the die on at least one side. The mold compound therefore extends around the die to cover the four sides of the rectangular die as shown in FIG. 2A and contacts the redistribution layer.

At 304 vias are formed in the mold compound by laser drilling or in any other way. The vias are formed vertically from the top of the mold compound near the back side of the die toward the redistribution layer. The vias are formed in a pattern such as in rows that traverse along each of the four sides of the die. In one example, the vias are formed in such a pattern as to create a Faraday cage. There may be one, two or more rows of vias formed through the mold compound to the RDL. The vias are placed so that the bottoms of the vias are over a ground connection pad of the RDL. In one embodiment, the RDL has a ground plane in a layer that extends around the die to connect with each of the shield vias. Alternatively, there may be a trace or line to connect the vias to a ground plane or ground connection of the RDL.

At 306 an electrically conductive film is applied over the mold compound. The conductive film may be deposited in any of a variety of different ways including sputtering. The film may be a metal such as copper or aluminum or any other conductive material. The film is connected to the ground connection of the RDL. In some embodiments, the conductive film in only some of the vias connects to the ground plane. The film is still grounded in all areas due to being a single film over all of the mold compound and all around the die.

At 308 the package is finished. The package may receive a cover, additional mold compound, additional back side layers, such as dielectric layers, additional RDLs, additional dies, additional connectors, such as solder balls or any other structures, depending on the particular package and how it is to be implemented.

Figure 4:
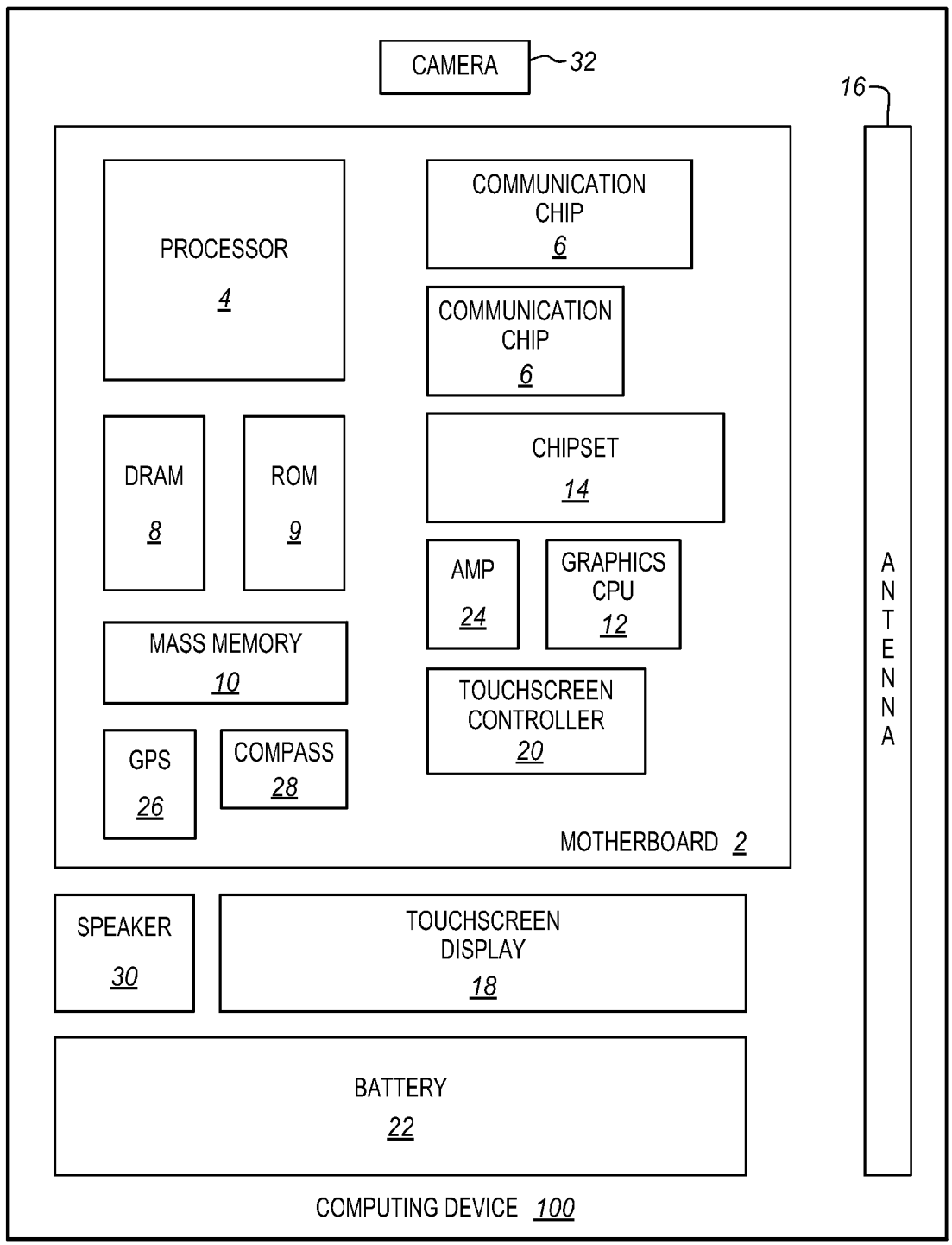
FIG. 4 is a block diagram of a computing device incorporating a package with an integral EMI shield according to an embodiment.

FIG. 4 illustrates a computing device 100 in accordance with one implementation of the invention. The computing device 100 houses a system board 2. The board 2 may include a number of components, including but not limited to a processor 4 and at least one communication package 6. The communication package is coupled to one or more antennas 16. The processor 4 is physically and electrically coupled to the board 2. At least one of either the RF or digital die packages shielded using a pattern of metal lined vias in the package and the metal layer and electrically coupled to the board 2 through the package. In some implementations of the invention, any one or more of the components, controllers, hubs, or interfaces are formed on dies using metal coated through mold vias as described above.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a package that has a semiconductor die, a redistribution layer, a mold compound over the die, a plurality of vias through the mold compound and outside the die to form a shield, and a metal film over the vias. and over the mold compound.

In further embodiments, the redistribution layer has a ground layer and the metal film is electrically connected to the ground layer. In further embodiments, the ground layer is connected to external connection pads of the redistribution layer to connect to an external ground. In further embodiments, the die is rectangular having four sides and the vias extend vertically from the redistribution layer on all four sides of the die.

In further embodiments, the vias are in straight rows along each of the four sides of the die. In further embodiments, the vias are further in a second straight row along each of the four sides of the die. In further embodiments, the vias of the second row alternate in position with the vias of the first row.

In further embodiments, the redistribution layer is a package substrate. In further embodiments, the redistribution layer is a bumpless build-up layer. In further embodiments, the vias are filled with an electrically conductive material. In further embodiments, the metal film is also over the mold compound. In further embodiments, the metal film is titanium or copper.

Some embodiments further include a panel level ball grid array to connect to a system board.

Some embodiments pertain to a method including forming a mold compound over a semiconductor die, the die being over a redistribution layer on a side opposite the mold compound, the redistribution layer extending past the die and the mold compound extending around the die to contact the redistribution layer, forming a plurality of vias in the mold compound vertically toward the redistribution layer, the vias being outside of the die, applying a conductive film over the mold compound and the vias, the metal film contacting the redistribution layer in the vias, the redistribution layer connecting the metal film to an external ground so that the vias form a shield, and finishing the mold compound and the redistribution layer to form a package In further embodiments, finishing the package comprises attaching solder balls to the redistribution layer opposite the die. In further embodiments, forming vias comprises laser drilling the mold compound. In further embodiments, the die is rectangular having four sides and forming vias comprises forming vias in rows on all four sides of the die. In further embodiments, forming vias comprises forming two rows of vias along each side of the die wherein the vias of each row alternate in position.

Some embodiments pertain to an apparatus that includes a system board, a radio frequency die package connected to the system board, and a shielded semiconductor device package connected to the system board, the semiconductor device package having a semiconductor die, a redistribution layer, a mold compound over the die, a plurality of vias through the mold compound and outside the die to form a shield, and a metal film over the vias. and over the mold compound.

In further embodiments, the vias are arranged in a row along each edge of the semiconductor die.

What is claimed is:

1. A shielded semiconductor device package comprising:
 a semiconductor die having a front side and a back side;
 a front side redistribution layer having a ground layer;
 a mold compound over the back side of the die and over the front side redistribution layer;
 a plurality of vias through the mold compound and outside the die to form a shield, wherein the bottoms of the vias are over a ground layer of the front side redistribution layer; and
 a single continuous metal shielding film over the back side of the mold compound and into the vias, wherein the shielding film in some of the vias directly connects to the ground layer and wherein the shielding film in some of the vias does not directly connect to the ground layer of the front side redistribution layer.

2. The package of claim 1, wherein the ground layer is connected to external connection pads of the redistribution layer to connect to an external ground.

3. The package of claim 1, wherein the die is rectangular having four sides and the vias extend vertically from the redistribution layer on all four sides of the die.

4. The package of claim 3, wherein the vias are in straight rows along each of the four sides of the die.

5. The package of claim 3, wherein the vias are further in a second straight row along each of the four sides of the die.

6. The package of claim 5, wherein the vias of the second row alternate in position with the vias of the first row.

7. The package of claim 1, wherein the redistribution layer is a package substrate.

8. The package of claim 1, wherein the redistribution layer is a bumpless build-up layer.

9. The package of claim 1, wherein the vias are filled with an electrically conductive material.

10. The package of claim 1, wherein the metal film is titanium or copper.

11. The package of claim 1, further comprising a panel level ball grid array to connect to a system board.

12. An apparatus comprising:
a system board;
a radio frequency die package connected to the system board; and
a shielded semiconductor device package connected to the system board, the semiconductor device package having a semiconductor die having a front side and a back side, a front side redistribution layer having a ground layer, a mold compound over the back side of the die and over the front side redistribution layer, a plurality of vias through the mold compound and outside the die to form a shield, wherein the bottoms of the vias are over a ground layer of the front side redistribution layer and a single continuous metal shielding film over the back side of the mold compound and into the vias, wherein the shielding film in some of the vias directly connects to the ground layer and wherein the shielding film in some of the vias does not directly connect to the ground layer of the front side redistribution layer.

13. The apparatus of claim 12, wherein the vies are arranged in a row along each edge of the semiconductor die.

* * * * *